United States Patent
Leobandung et al.

(10) Patent No.: US 12,107,119 B2
(45) Date of Patent: Oct. 1, 2024

(54) SEMICONDUCTOR STRUCTURE WITH DIFFERENT CRYSTALLINE ORIENTATIONS

(71) Applicant: International Business Machines Corporation, Armonk, NY (US)

(72) Inventors: Effendi Leobandung, Stormville, NY (US); Tze-Chiang Chen, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 512 days.

(21) Appl. No.: 17/479,522

(22) Filed: Sep. 20, 2021

(65) Prior Publication Data
US 2023/0090017 A1  Mar. 23, 2023

(51) Int. Cl.
*H01L 29/04* (2006.01)
*H01L 27/06* (2006.01)
*H01L 29/20* (2006.01)

(52) U.S. Cl.
CPC ........ *H01L 29/045* (2013.01); *H01L 27/0617* (2013.01); *H01L 29/2003* (2013.01)

(58) Field of Classification Search
CPC ............... H01L 29/045; H01L 29/2003; H01L 29/66522; H01L 29/165; H01L 29/205; H01L 29/78; H01L 21/02381; H01L 21/0243; H01L 21/02433; H01L 21/0254; H01L 21/02609; H01L 21/02639; H01L 21/02647; H01L 21/8258; H01L 27/0617; H01L 27/0623; H01L 27/088
See application file for complete search history.

(56) References Cited

U.S. PATENT DOCUMENTS

| | | | |
|---|---|---|---|
| 7,968,913 B2 | 6/2011 | Hopper et al. | |
| 8,866,190 B2 | 10/2014 | Briere | |
| 9,006,083 B1 | 4/2015 | Kumar | |
| 9,059,075 B2 | 6/2015 | Bayram et al. | |
| 9,640,422 B2 | 5/2017 | Dasgupta et al. | |
| 10,163,731 B2 | 12/2018 | Ching et al. | |
| 2004/0227187 A1* | 11/2004 | Cheng | H01L 29/66795 438/479 |

(Continued)

OTHER PUBLICATIONS

A. Krost and A. Dadgar, "Heteroepitaxy of GaN on Si(111)," 12th International Conference on Semiconducting and Insulating Materials, 2002. SIMC-XII-2002., Slomenice, Slovakia, 2002, pp. 41-47, doi: 10.1109/SIM.2002.1242722 (Year: 2002).*

(Continued)

*Primary Examiner* — Sitaramarao S Yechuri
(74) *Attorney, Agent, or Firm* — Samuel Waldbaum; Ryan, Mason & Lewis LLP (57) ABSTRACT

A semiconductor structure comprises a semiconductor substrate including a first silicon substrate component having a first crystalline orientation and a second silicon substrate component over the first silicon substrate and having a second crystalline orientation different from the first crystalline orientation. The semiconductor substrate defines a trench extending through the second silicon substrate component and at least partially within the first silicon substrate component. A gallium nitride structure is disposed within the trench of the semiconductor substrate.

20 Claims, 12 Drawing Sheets

(56) References Cited

U.S. PATENT DOCUMENTS

2011/0163410 A1* 7/2011 Signamarcheix ............................ H01L 21/823807
438/459
2018/0114693 A1* 4/2018 Odnoblyudov ......... C30B 25/18
2019/0051562 A1 2/2019 Radosavljevic et al.

OTHER PUBLICATIONS

E. L. Piner, "Integration of gallium nitride and silicon: From devices to Diamond," IEEE 2011 International SOI Conference, Tempe, AZ, USA, 2011, pp. 1-18, doi: 10.1109/SOI.2011.6081705 (Year: 2011).*
C. Liu, R. Abdul Khadar and E. Matioli, "GaN-on-Si Quasi-Vertical Power MOSFETs," in IEEE Electron Device Letters, vol. 39, No. 1, pp. 71-74, Jan. 2018, doi: 10.1109/LED.2017.2779445 (Year: 2018).*

* cited by examiner

SEMICONDUCTOR STRUCTURE WITH DIFFERENT CRYSTALLINE ORIENTATIONS

BACKGROUND

Gallium nitride is a unique semiconductor material which is gaining interest in high speed and high-power semiconductor applications including, for example, optoelectronics, photovoltaics and lighting. However, integrating gallium nitride on a silicon wafer or substrate, particularly, a crystalline silicon with a Miller index of (100), is difficult due to a variety of reasons including expense, lack of technology, and other manufacturing obstacles. Thus, a crystalline silicon substrate with a Miller index of (111) is typically used as the substrate base upon which to grow a gallium nitride semiconductor structure. Unfortunately, a (111) crystalline silicon substrate is incompatible with standard complementary metal oxide semiconductor (CMOS) silicon devices used in the manufacture of other semiconductor structures, thus presenting performance and scaling issues, particularly, in view of the atomic scaling level approaches currently being pursued by the semiconductor industry.

SUMMARY

Illustrative embodiments provide techniques for forming semiconductor structures and, more specifically, techniques for integrating semiconductor structures on a substrate including different crystalline orientations.

For example, in an illustrative embodiment, a semiconductor structure comprises a semiconductor substrate including a first silicon substrate component having a first crystalline orientation and a second silicon substrate component over the first silicon substrate and having a second crystalline orientation different from the first crystalline orientation. The semiconductor substrate defines a trench extending through the second silicon substrate component and at least partially within the first silicon substrate component. A gallium nitride structure is disposed within the trench of the semiconductor substrate.

In another illustrative embodiment, a semiconductor structure comprises a semiconductor base substrate including a gallium nitride component having a first crystalline orientation and a silicon substrate component having a second crystalline orientation different from the first crystalline orientation. A first semiconductor device is integrated with the gallium nitride component. A second semiconductor device is integrated with the silicon substrate component, and is different from the first semiconductor device.

In yet another illustrative embodiment, a method comprises forming a semiconductor substrate including a first silicon substrate component having a first crystalline orientation and a second silicon substrate component over the first silicon substrate and having a second crystalline orientation different from the first crystalline orientation, forming a trench within the semiconductor substrate extending through the second silicon substrate component and at least partially within the first silicon substrate component, and forming a gallium nitride structure within the trench of the semiconductor substrate.

DETAILED DESCRIPTION

In general, the various processes used to form a microchip that will be packaged into an IC fall into four general categories, namely, film deposition, removal/etching, semiconductor doping and patterning/lithography. Deposition is any process that grows, coats, or otherwise transfers a material onto a semiconductor device. Available technologies include physical vapor deposition (PVD), chemical vapor deposition (CVD), electrochemical deposition (ECD), molecular beam epitaxy (MBE) and, more recently, atomic layer deposition (ALD) among others. Removal/etching is any process that removes material from the semiconductor structure. Examples include etch processes (either wet or dry), and chemical-mechanical planarization (CMP), and the like. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to an underlying substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the substrate, for example, a wafer, is aligned to the previously formed patterns and slowly the conductors, insulators and selectively doped regions are built up to form the final device.

The various layers, structures, and regions shown in the accompanying drawings are schematic illustrations that are not drawn to scale. In addition, for ease of explanation, one or more layers, structures, and regions of a type commonly used to form semiconductor devices or structures may not be explicitly shown in a given drawing. This does not imply that any layers, structures, and regions not explicitly shown are omitted from the actual semiconductor structures. Furthermore, the embodiments discussed herein are not limited to the particular materials, features, and processing steps shown and described herein. In particular, with respect to semiconductor processing steps, it is to be emphasized that the descriptions provided herein are not intended to encompass all of the processing steps that may be required to form a functional semiconductor integrated circuit device. Rather, certain processing steps that are commonly used in forming semiconductor devices, such as, e.g., film deposition, removal/etching, semiconductor doping, patterning/lithography and annealing steps, are purposefully not described in great detail herein for economy of description.

Moreover, the same or similar reference numbers are used throughout the drawings to denote the same or similar features, elements, or structures, and thus, a detailed explanation of the same or similar features, elements, or structures will not be repeated for each of the drawings. The terms "about" or "substantially" as used herein with regard to thicknesses, widths, percentages, ranges, etc., are meant to denote being close or approximate to, but not exactly. For example, the term "about" or "substantially" as used herein implies that a small margin of error is present. Further, the terms "vertical" or "vertical direction" or "vertical height" as used herein denote a Z-direction of the Cartesian coordinates shown in the drawings, and the terms "horizontal," or "horizontal direction," or "lateral direction" as used herein denote an X-direction and/or Y-direction of the Cartesian coordinates shown in the drawings.

Additionally, the term "illustrative" is used herein to mean "serving as an example, instance or illustration." Any embodiment or design described herein is intended to be "illustrative" and is not necessarily to be construed as preferred or advantageous over other embodiments or designs. The term "connection" can include both an indirect "connection" and a direct "connection." The terms "on" or "onto" with respect to placement of components relative to the semiconductor structure are not to be interpreted as requiring direct contact of the components for it is possible one or more intermediate components, layers or coatings may be positioned between the select components unless otherwise specified. More specifically, positional relationships, unless specified otherwise, can be direct or indirect, and the present disclosure is not intended to be limiting in this respect.

As previously noted herein, for the sake of brevity, conventional techniques related to semiconductor device and integrated circuit (IC) fabrication may or may not be described in detail herein. Although specific fabrication operations used in implementing one or more embodiments of the present disclosure can be individually known, the described combination of operations and/or resulting structures of the present disclosure are unique. Thus, the unique combination of the operations described in connection with the fabrication of a semiconductor structure including a semiconductor substrate, formed of (111) crystalline silicon layer and a (100) crystalline silicon, and having one or more semiconductor devices associated with the silicon layers according to illustrative embodiments utilize a variety of individually known physical and chemical processes performed on a semiconductor (e.g., silicon) substrate, some of which are described in the immediately following paragraphs.

In the discussion that follows, the semiconductor device, which will incorporate one or semiconductor devices including complementary metal-oxide-semiconductor (CMOS) devices, such as metal-oxide-semiconductor field-effect transistor (MOSFETs), and/or fin field-effect transistors (FINFETs) will be referred to as the "semiconductor structure 100" throughout the various stages of fabrication, as represented in all the accompanying drawings. In addition, the following discussion will identify various intermediate stages of fabrication of the semiconductor structure 100. It is to be understood that the intermediate stages are exemplative only. More or less intermediate stages may be implemented in processing the semiconductor structure 100, and the disclosed stages may be in different order or sequence. In addition, one or more processes may be incorporated within various intermediate stages as described herein, and one or more processes may be implemented in intermediate stages as otherwise described herein.

Figure 1:
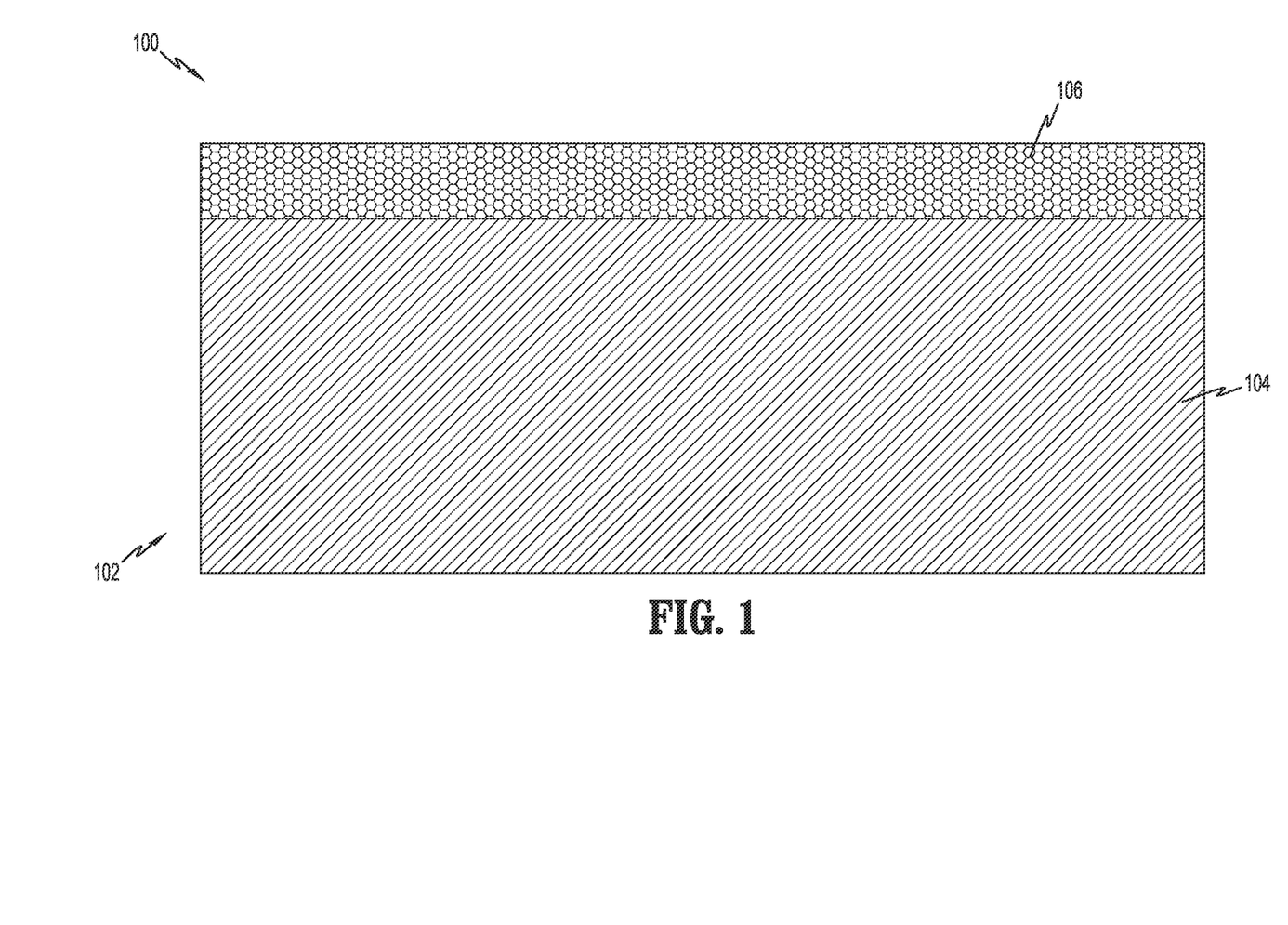
FIG. 1 is a cross-sectional view of a semiconductor structure illustrating a semiconductor substrate including a (111) crystalline silicon layer and a (100) crystalline silicon layer on the (111) crystalline silicon layer according to one or more illustrative embodiments.

FIG. 1 is a cross-sectional view of the semiconductor structure 100 at an early stage of fabrication. The semiconductor structure 100 includes a semiconductor substrate 102 which may be in the form of a wafer or the like. The semiconductor substrate 102 includes two component sections namely an underlying crystalline (111) silicon substrate component 104 and an upper crystalline (100) silicon substrate component 106 disposed on the underlying (111) silicon substrate component 104. The terms "(111) silicon" denotes a silicon layer which has a <111> crystallographic surface orientation and the term "(100) silicon" denotes a silicon layer which has a <100> crystallographic surface orientation. The orientation of the silicon is classified by which orientation plane the surface of the substrate is parallel. In general, the planes are defined by the "Miller Indices" methodology, which provides a conventional method to specify planes and direction in a silicon crystal. Common orientations classified by the "Miller indices" are (100), (011), (110), and (111). The underlying (111) silicon substrate component 104 and the upper (100) silicon substrate component 106 each may comprise multiple layers grown into desired thicknesses via conventional semiconductor wafer manufacturing processes. In one illustrative embodiment, the thickness of the underlying (111) silicon substrate component 104 ranges from about 10 to 1000 micrometers (μm) and the thickness of the upper (100) silicon substrate component 106 ranges from about 0.5 to 1.5 micrometers (μm), or about 1 micrometer (μm). Other dimensions or thicknesses are also envisioned. The upper (100) silicon substrate component 106 may be grown on and/or otherwise bonded to the underlying (111) silicon substrate component 104. The upper (100) silicon substrate component 106 can be bonded to the underlying (111) silicon substrate component 104 and may be subjected to a polishing process, such as a chemical mechanical polishing or planarization (CMP) process, to achieve the desired thickness. The underlying (111) silicon substrate component 104 and/or the upper (100) silicon substrate component 106 may be doped, undoped or contain regions that are doped and other regions that are non-doped. The dopant may be an n-type dopant selected from an Element from Group VA of the Periodic Table of Elements (i.e., P, As and/or Sb) or a p-type dopant selected from an Element from Group IIIA of the Periodic Table of Elements (i.e., B, Al, Ga and/or In). The upper (100) silicon substrate component 106 may contain one region that is doped with a p-type dopant and other region that is doped with an n-type dopant.

Figure 2:
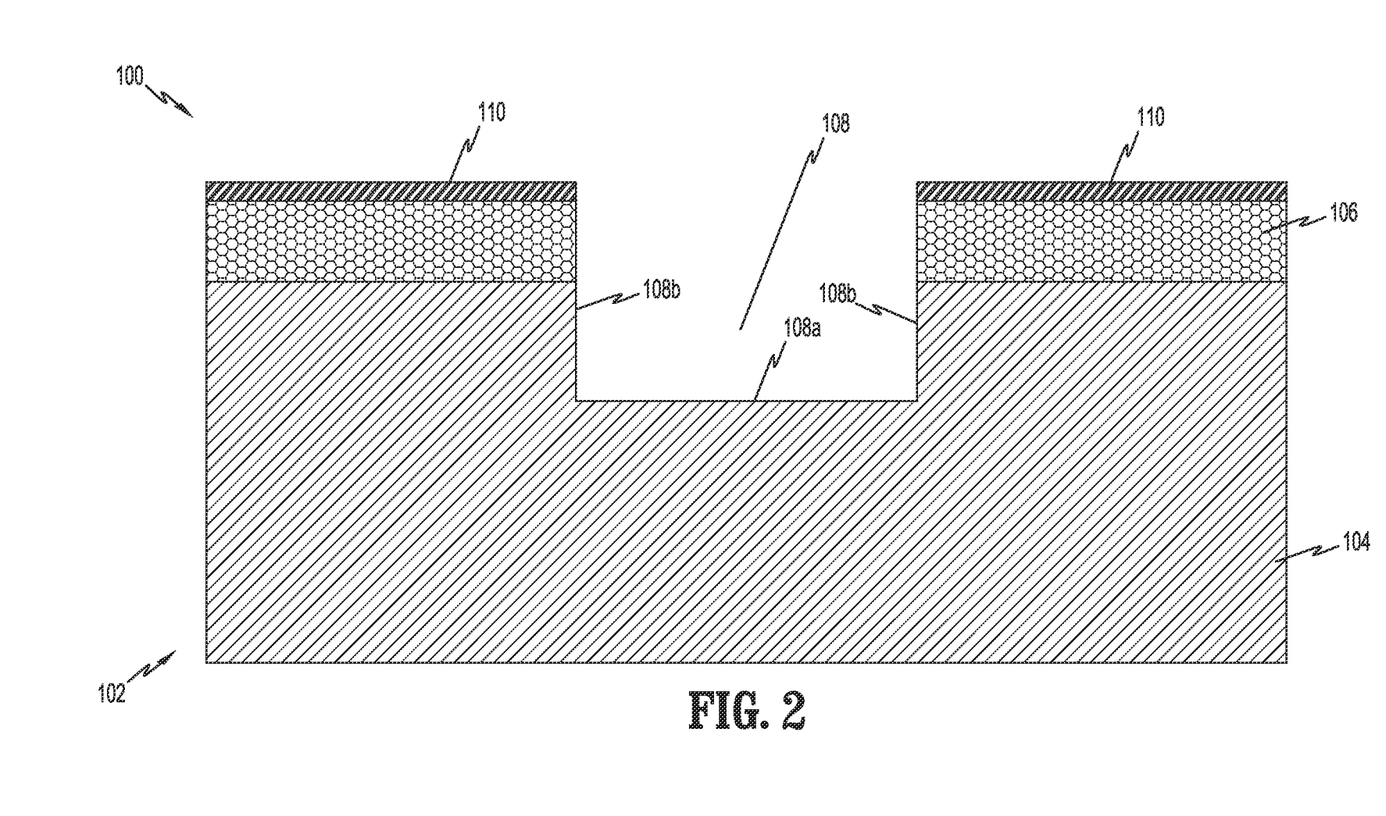
FIG. 2 is a cross-sectional view of the semiconductor structure illustrating formation of a patterned trench in the semiconductor substrate extending into the (111) crystalline silicon layer according to one or more illustrative embodiments.

Referring now to FIG. 2, a trench 108 is formed in the upper (100) silicon substrate component 106 to extend into the underlying (111) silicon substrate component 104 a predetermined distance. Patterning of the upper (100) silicon substrate component 106 can be implemented using any conventional photolithography and etching process, e.g., forming a photoresist mask on the upper surface of the upper (100) silicon substrate component 106, which comprises an image of the trench opening to be etched into the upper (100) silicon substrate component 106, followed by etching the material of the upper (100) silicon substrate component 106 and the underlying (111) silicon substrate component 104 using a dry etch process such as RIE (reactive ion etching). In illustrative embodiments, the etching process is controlled to extend the depth of the trench into the underlying (111) silicon substrate component 104 for a distance generally approximating the thickness of the upper (100) silicon substrate component 106. Other dimensions are also envisioned. The formed trench 108 includes a lower trench surface 108a defined in the underlying (111) silicon substrate component 104 and two side wall trench surfaces 108b spanning both the underlying (111) silicon substrate component 104 and the upper (100) silicon substrate component 106.

With continued reference to FIG. 2, a hard mask layer 110 is formed on the upper (100) silicon substrate component 106. In illustrative embodiments, a blanket layer of a single hard mask material may be used as hard mask 110. The hard mask film or layer 110 may include any suitable material, such as, for example, a silicon oxynitride (SiON), silicon dioxide (SiO2), an SiOxNy. etc. The hard mask layer 110 may be deposited on the semiconductor substrate 102 using any known techniques including, for example, a plasma enhanced atomic layer deposition (PEALD) process, a plasma-enhanced chemical vapor deposition (PECVD) process or a physical vapor deposition (PVD) process, chemical vapor deposition (CVD), (atomic layer deposition) ALD, etc. The hard mask layer 110 may comprise multiple layers of the same or optionally different material. The hard mask material of the hard mask layer 110 is selected to eventually be etched away by any suitable etching process including, for example, a reactive ion etching (RIE) (with, e.g., a halogen-based plasma chemistry) or wet etching. The thickness of the hard mask layer 110 may range from about 25 nanometers (nm) to about 75 nanometers (nm), or about 50 nanometers (nm). The deposition process is controlled, via masking or the like, such that the lower trench surface 108a defined in the underlying (111) silicon substrate component 104 is devoid of the hard mask layer 110. The hard mask layer 110 may, in illustrative embodiments, be formed as part of the formation of the trench 108.

Figure 3:
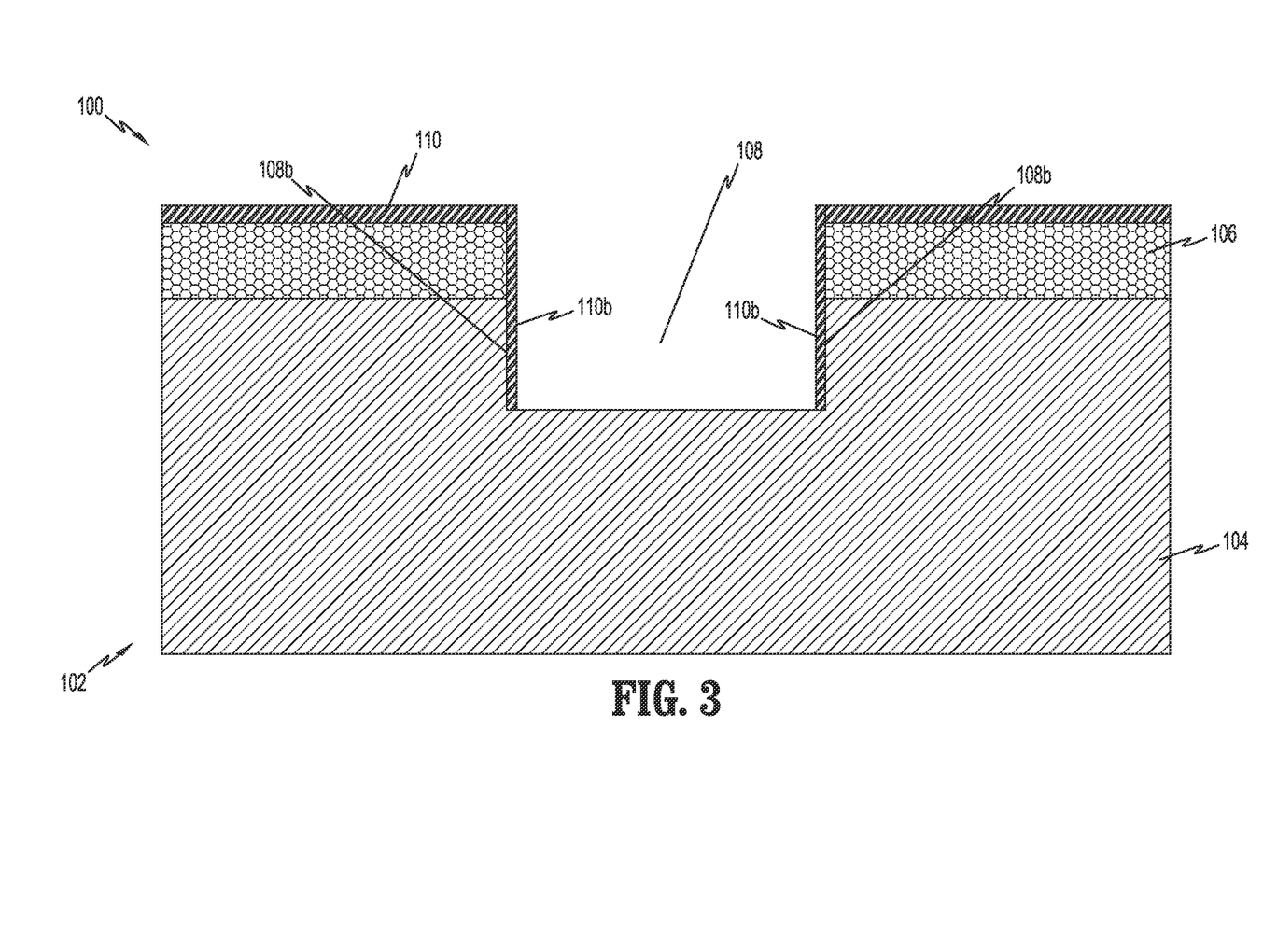
FIG. 3 is a cross-sectional view of the semiconductor structure illustrating formation of a hard mask layer on the semiconductor substrate and on side walls of the trench according to one or more illustrative embodiments.

Referring now to FIG. 3, a hard mask layer 110b is also formed on the two side wall trench surfaces 108b of the trench 108. In illustrative embodiments, the hard mask layer 110b may be deposited on the side wall trench surfaces 108b and etched via conventional methodologies. The hard mask layer 110b may include any of the materials identified hereinabove. In illustrative embodiments, the hard mask layer 110b is formed in separate deposition and etching processes from formation of the hard mask layer 110. In other illustrative embodiments, the hard mask layer 110b is formed simultaneously with formation of the hard mask layer 110.

Figure 4:
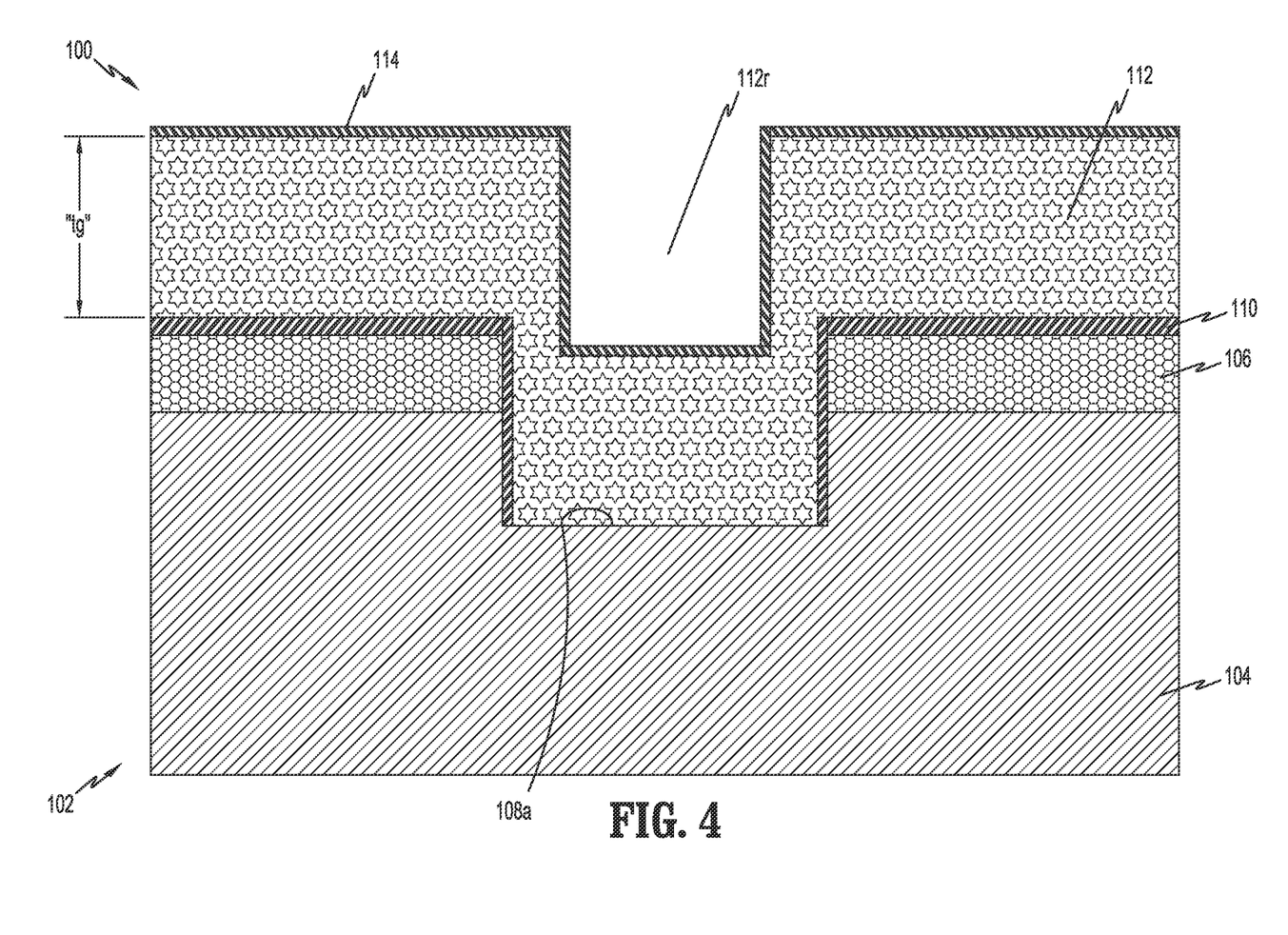
FIG. 4 is a cross-sectional view of the semiconductor structure illustrating formation of a gallium nitride layer on the semiconductor substrate and a liner formed on the gallium nitride layer according to one or more illustrative embodiments.

With reference to FIG. 4, subsequent to forming the hard mask layer 110, a gallium nitride (GaN) layer 112 is grown on the semiconductor structure 100, specifically, on the lower trench surface 108a of the underlying (111) silicon substrate component 104. The GaN layer 112 can overgrow onto top of hard mask layer 110 from the lower trench surface 108a or it can be deposited independently on hard mask layer 110. The GaN layer 112 grown from lower trench surface 108a is single crystal material while GaN layer 112 deposited on hard mask layer 110 is amorphous material. The GaN layer 112 may be fabricated via a metalorganic chemical vapor deposition (MOCVD) process. MOCVD processes are an industry standard for epitaxial growth of compound semiconductors on a crystalline substrate, providing cost-effective and mass production capabilities. In one illustrative embodiment, the GaN layer 112 is pure gallium nitride. The gallium nitride layer has a crystallographic surface orientation different from the <100> crystallographic surface orientation of the upper (100) silicon substrate component 106. In illustrative embodiments, the gallium nitride layer has a <111> crystallographic surface orientation. In other illustrative embodiments, the GaN layer 112 comprises gallium nitride that includes at least one other Group III element such as, for example, Al and/or In. In these embodiments, the GaN layer 112 may comprise gallium aluminum nitride (GaAlN), gallium indium nitride (GaInN) or gallium aluminum indium nitride (GaAlInN).

The GaN layer 112 is contiguous across the surface of the hard mask layer 110 and along the lower trench surface 108a of the trench, and generally follows the contour of the trench 108 to define a recess 112r in the GaN layer 112 vertically aligned with the trench 108. The height or thickness of the GaN layer 112 may range from about 1.5 micrometers to about 2.5 micrometers, or about 2 micrometers. The thickness may remain constant along the entirety of the of the GaN layer 112.

In addition, or in conjunction therewith, a thin secondary layer 114 of aluminum gallium nitride (AlGaN) is grown on the GaN layer 112. The thin secondary layer 114 ranges in thickness from about 15 nanometers (nm) to about 25 nanometers (nm), or about 20 nanometers (nm). The thin secondary layer 114 is optional and can be used to protect the surface of GaN layer, provide high mobility layer to improve performance, or as a good interface for a subsequent gate dielectric. The thin secondary layer 114 can be deposited using same method as GaN layer 112.

Figure 5:
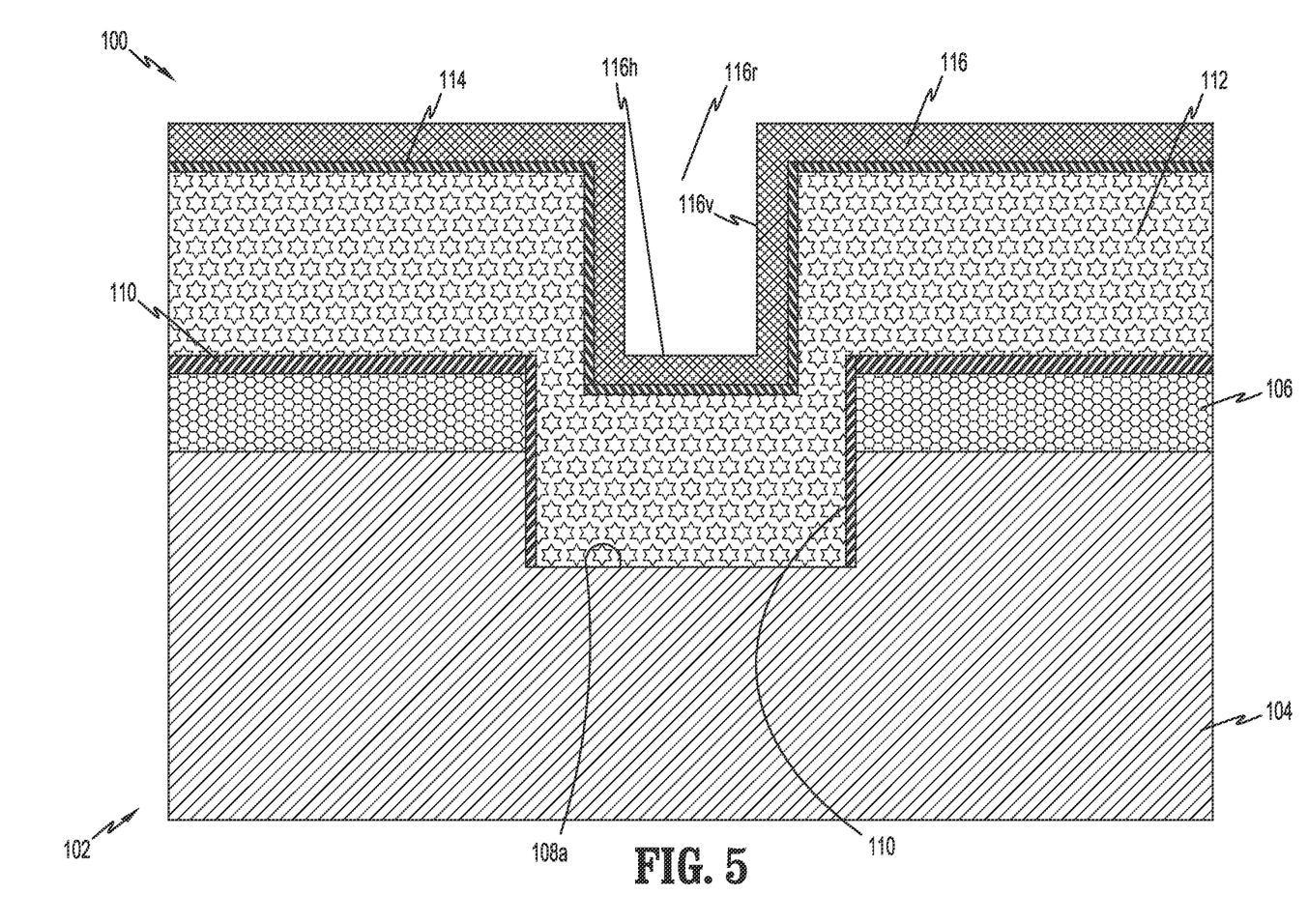
FIG. 5 is a cross-sectional view of the semiconductor structure illustrating deposition of an oxide layer on the semiconductor substrate according to one or more illustrative embodiments.

Referring now to FIG. 5, the process is continued by depositing an oxide layer 116 onto the thin secondary layer 114 to envelop the semiconductor structure 100. In illustrative embodiments, the oxide layer 116 can be silicon oxide (SiO$_2$), a silicon oxide/silicon borocarbonitride (SiBCN) bilayer or a derivation of TEOS (tetraethylorthosilicate), which can be deposited via a chemical vapor deposition (CVD) process, an atomic layer deposition (ALD) process, a plasma enhanced chemical vapor deposition (PECVD) and/or combinations thereof. The oxide layer 116 may range in thickness from about 75 nanometers (nm) to about 125 nanometers, or about 100 nanometers (nm). The oxide layer 116 can be formed by first depositing an oxide material that can at least partially fill the recess 112r in the GaN layer 112 and extend along the upper surface of the thin secondary layer 114. Thus, the oxide layer 116 is generally u-shaped in cross-section having vertical portions 116v and horizontal portion 116h extending between the vertical portions 116v and defining a recess 116r. The oxide layer 116 may comprise a flowable oxide. In illustrative embodiments, a planarization process may be utilized subsequent to deposition of the oxide layer to provide the exemplary semiconductor structure shown in FIG. 5.

Figure 6:
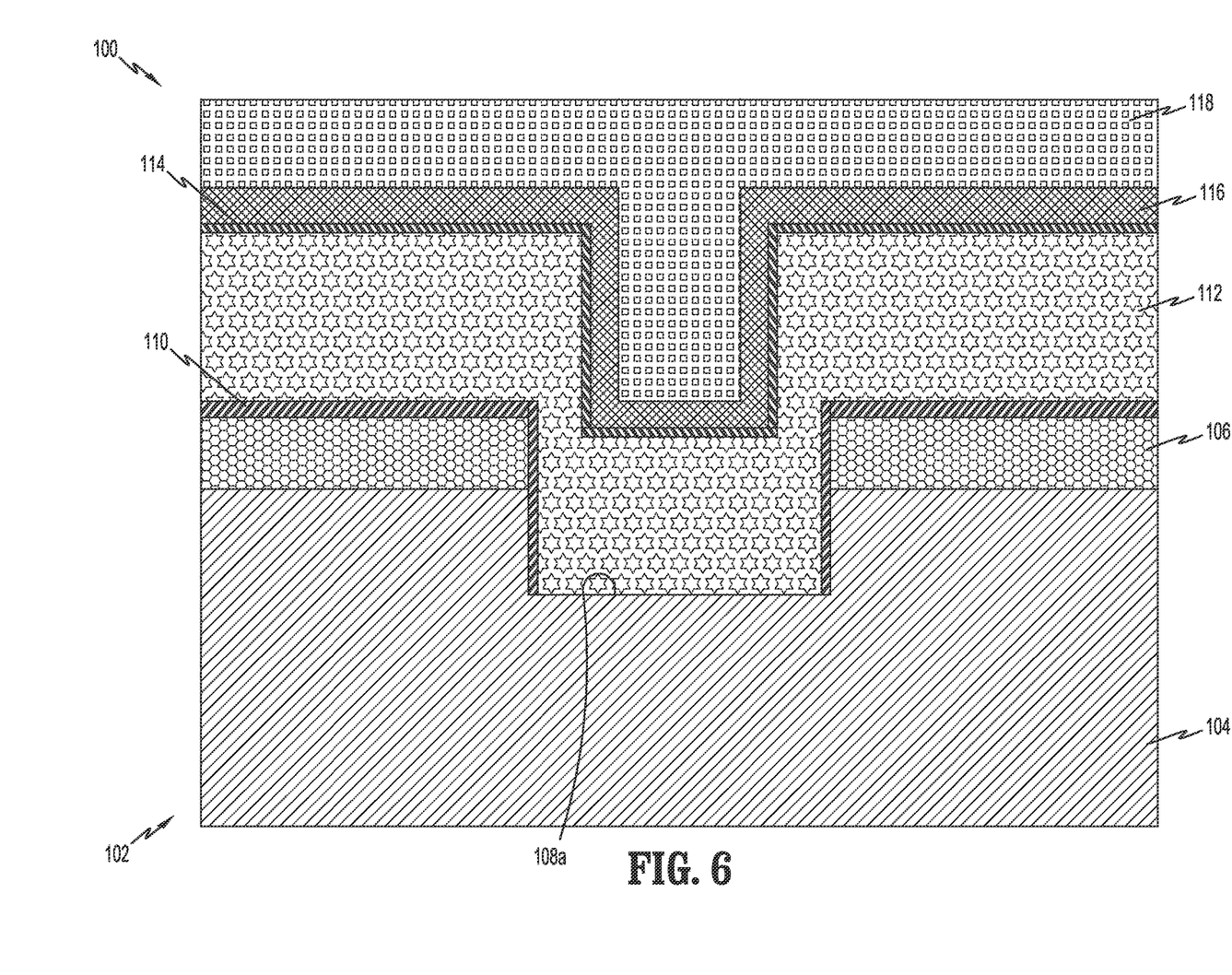
FIG. 6 is a cross-sectional view of the semiconductor structure illustrating formation of a resist layer on the oxide layer on the semiconductor substrate according to one or more illustrative embodiments.

Referring now to FIG. 6, subsequent to deposition of the oxide layer 116, a resist layer 118 is deposited on the semiconductor substrate 102. In illustrative embodiments, the resist layer 118 comprises a photoresist material (and may include an optional antireflective layer). In an illustrative embodiment, the resist layer 118 is formed by depositing (e.g., spin coating) a layer of photoresist material over the oxide layer 116, and then exposing and developing the layer of photoresist material to form a photoresist pattern. In some embodiments, the thickness of the resist layer 118 is in a range of about 20 nm to about 800 nm, although lesser and greater thicknesses can also be employed. The resist layer 118 can be a layer of a positive photoresist material that is sensitive to deep-ultraviolet (DUV) radiation, extreme ultraviolet (EUV), or mid-ultraviolet (MUV) radiation as known in the art, or the photoresist layer can be an e-beam resist material that is sensitive to radiation of energized electrons. Negative photoresist material is also contemplated. Other suitable materials for resist layer 118 include electron-beam resists, ion-beam resists, X-ray resists, and etch resists. Alternatively, the resist material may a polymeric spin on material or a polymeric material.

Figure 7:
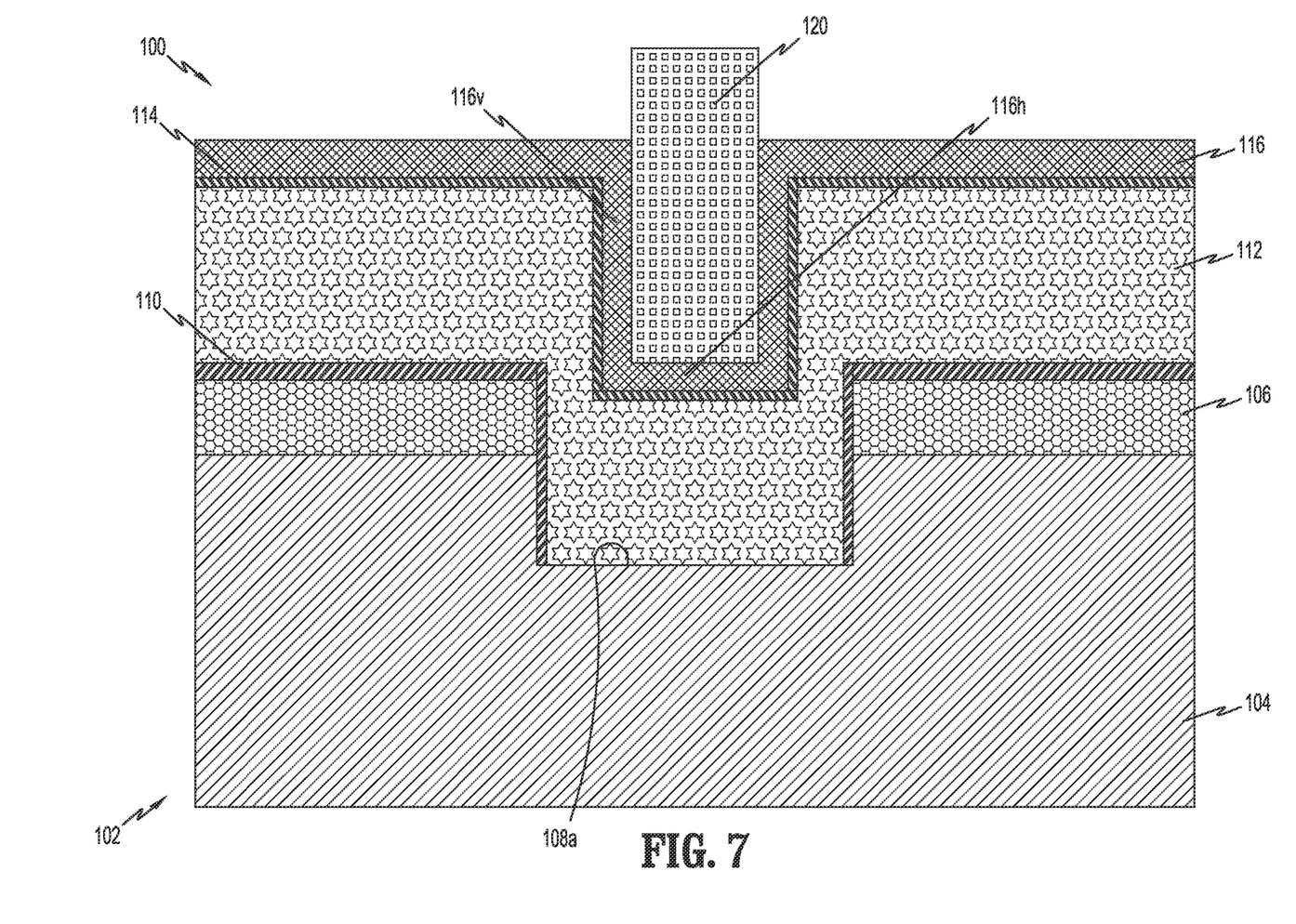
FIG. 7 is a cross-sectional view of the semiconductor structure subsequent to patterning the resist layer according to one or more illustrative embodiments.

Referring now to FIG. 7, the resist layer 118 is patterned to maintain a portion of the resist layer 118 as a resist mask 120 within and/or overlying the trench collectively formed by the recess 112r of the GaN layer 112 and the recess 116r of the oxide layer 116. By this patterning, the oxide layer 116, including the vertical portions 116v, is exposed with the exception of the horizontal portion 116h of the oxide layer 116 beneath or underlying the resist mask 120.

Figure 8:
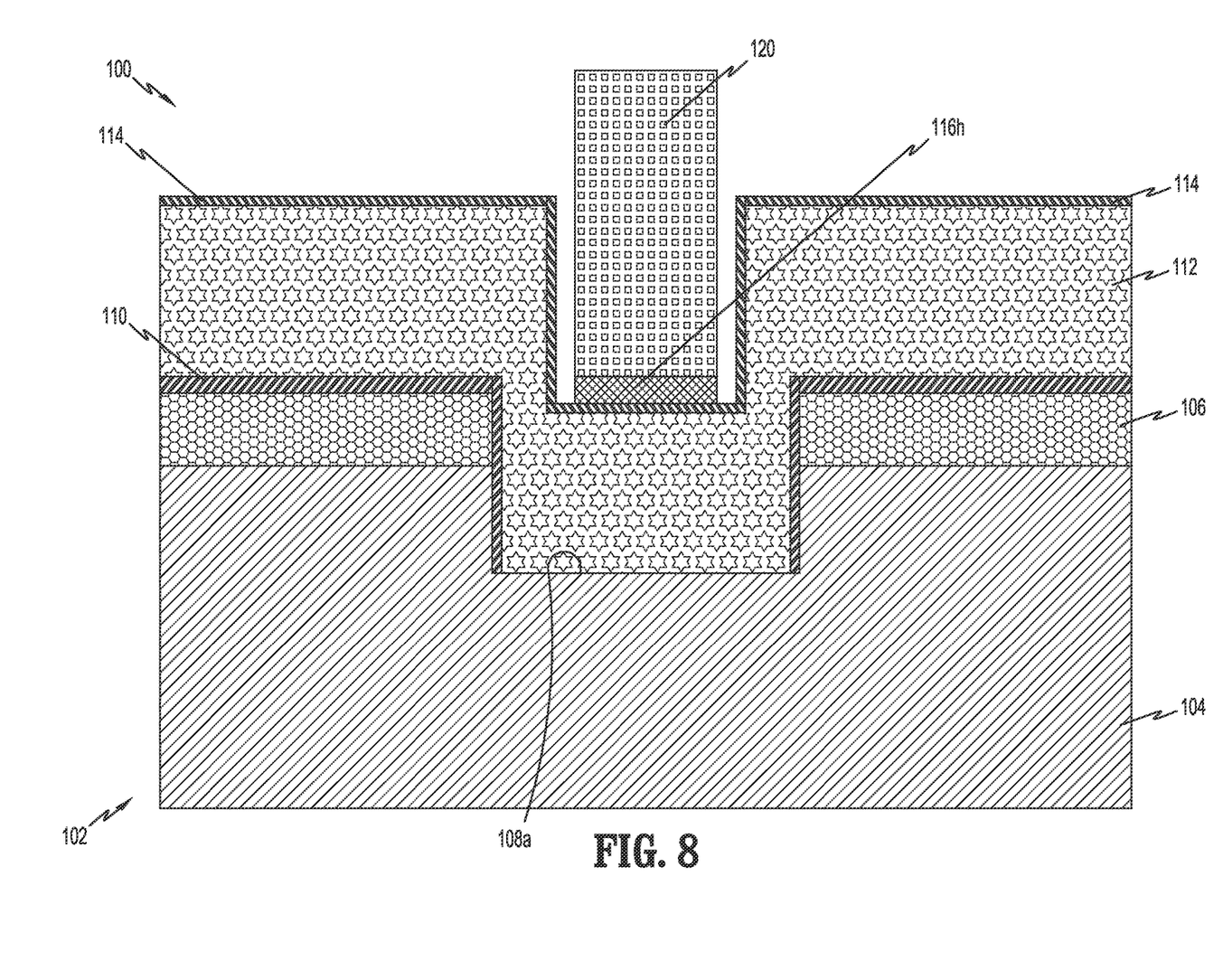
FIG. 8 is a cross-sectional view of the semiconductor structure subsequent to removal of the oxide layer according to one or more illustrative embodiments.

With reference to FIG. 8, in a next intermediate stage of fabrication, the exposed oxide material of the oxide layer 116 is selectively etched to remove the oxide layer 116 with the exception of the horizontal portion 116h of the oxide layer 11 beneath the resist mask 120. Any suitable etching process may be utilized including a wet etch process and/or a dry etch process such as RIE (reactive ion etching or plasma etching). The etching sequence of, for example, a silicon oxide material forming the oxide layer 116 may include a wet etching process such as HF etching, for example, HF (hydrofluoric acid) or buffered HF. The etching processes may be selective to the material of the thin secondary layer 114.

Figure 9:
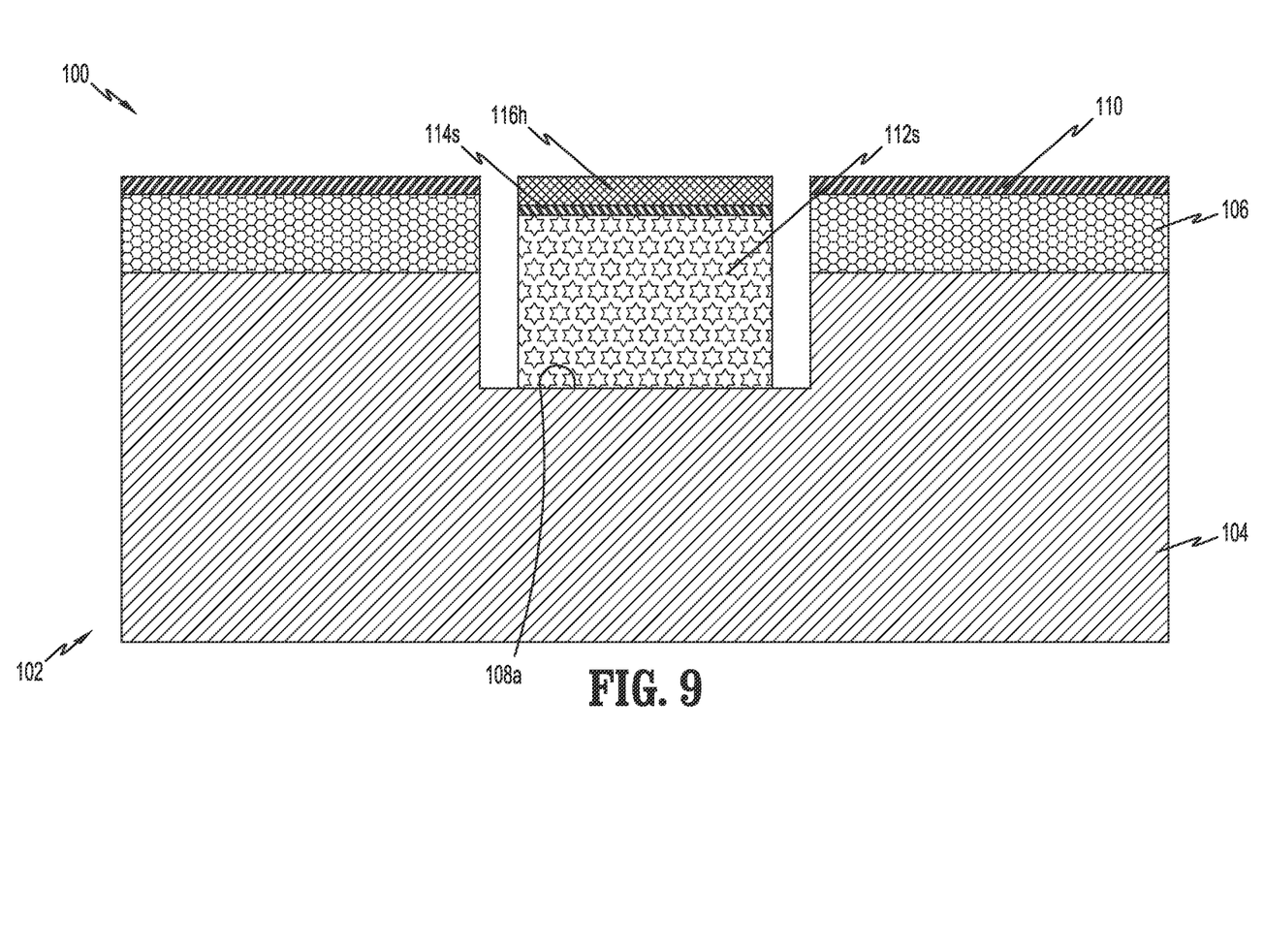
FIG. 9 is a cross-sectional view of the semiconductor structure subsequent to a removal process illustrating removal of the gallium nitride layer with a remaining portion of the gallium nitride layer disposed within the patterned trench in the semiconductor substrate according to one or more illustrative embodiments.

Referring now to FIG. 9, the remaining resist mask 120, the thin secondary layer 114 and the GaN layer 112 are removed via one or more etching processes. For example, the resist mask 120 may be removed using a suitable process such as, for example, an ash etching process. The etching material can be an oxygen ash or a nitrogen or hydrogen-based chemistry including, e.g., nitrogen gas or hydrogen gas, or a combination thereof. The GaN layer 112 and the thin secondary layer 114 may be removed by one or more anisotropic etch processes, including a reactive ion etch (RIE), or an isotropic etch process, such as a wet chemical etch, or a combination of both. In one example, the etch process for removing the GaN layer 112 can include an etch chemistry at least selective to the material of the remaining oxide layer horizontal portion 116h and the thin hard mask layer 110. As shown in FIG. 9, subsequent to the one or more etching processes, a segment 112s of the GaN layer 112 (having the <111> crystallographic surface orientation) and a segment 114s of the thin secondary layer 114, each beneath the horizontal portion 116h of the oxide layer 116, remain within the semiconductor structure 100. The segment 112s of the GaN layer 112 will eventually form a substrate upon which a semiconductor device may be built or integrated therewith.

Figure 10:
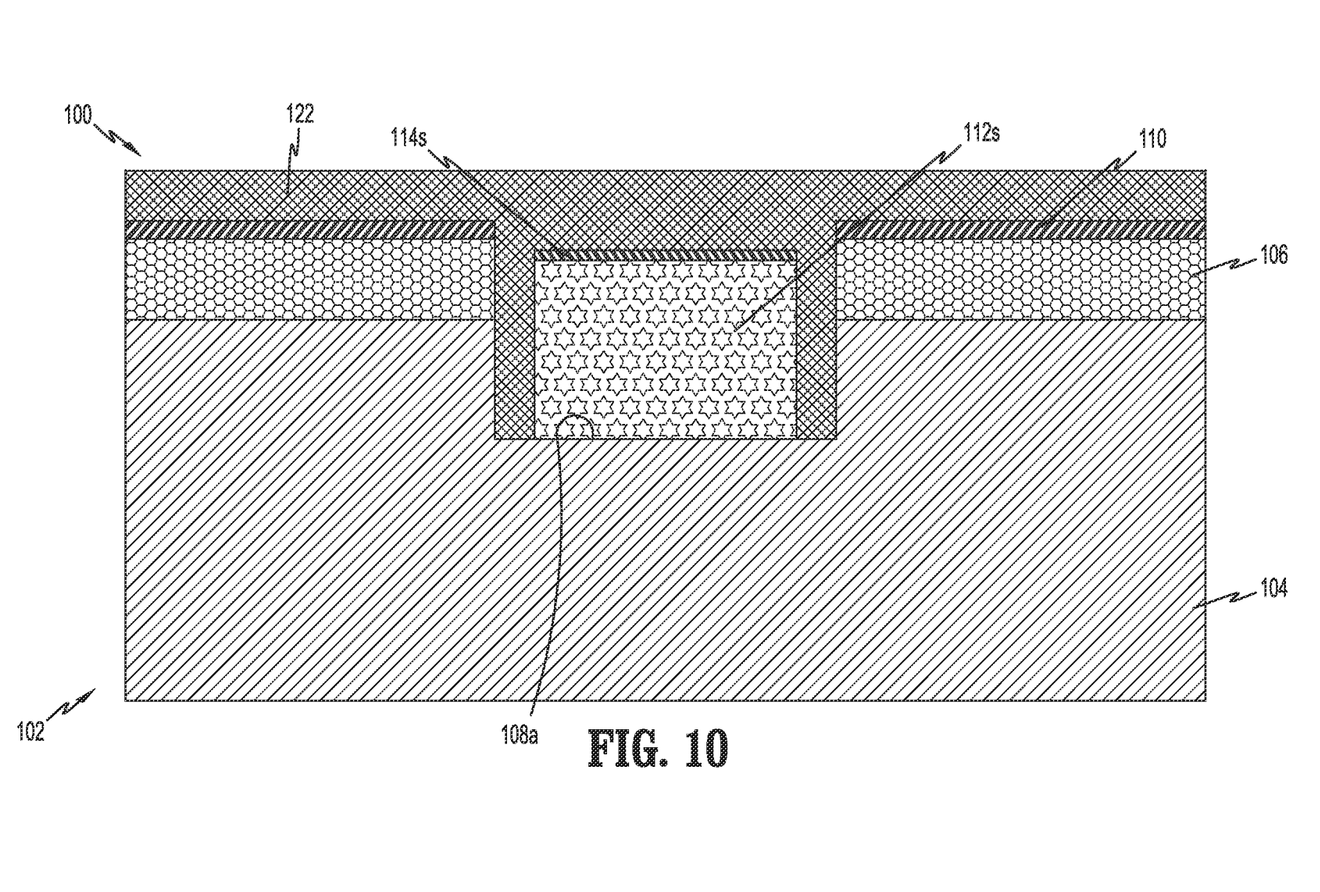
FIG. 10 is a cross-sectional view of the semiconductor structure illustrating deposition of a second oxide layer on the semiconductor substrate and on the remaining portion of the gallium nitride according to one or more illustrative embodiments.

With reference to FIG. 10, a second oxide layer 122 is deposited on the semiconductor structure 100 to cover the hard mask layer 110 and fill the remaining portion of the trench 108 (FIG. 2) surrounding the segments 112s, 114s of the GaN layer 112 and the thin secondary layer 114 respectively. The second oxide layer 122 may comprise the same materials as the first oxide layer (oxide layer 116) and may be deposited in accordance with the methodologies described hereinabove. The thickness of the second oxide layer 122 may range between about 50 nanometers (nm) and 100 nanometers (nm).

Figure 11:
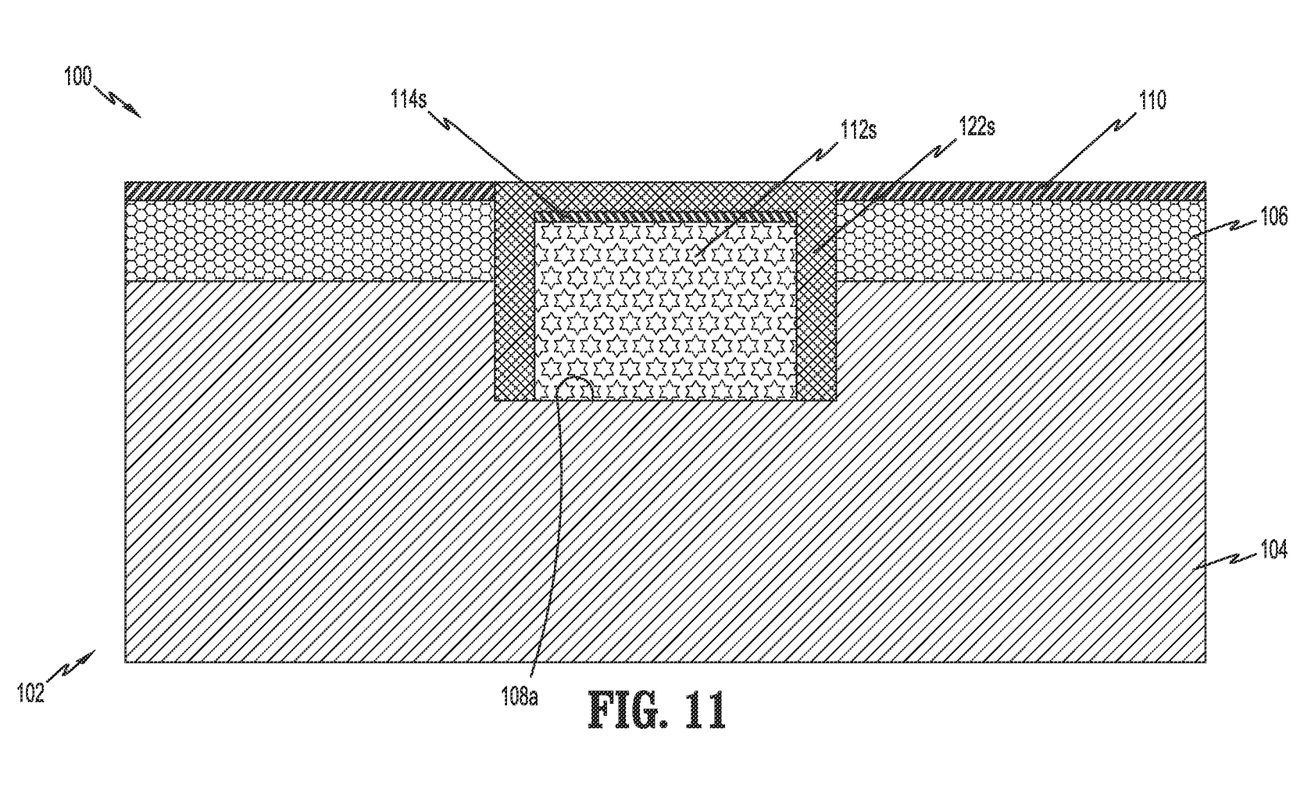
FIG. 11 is a cross-sectional view of the semiconductor structure subsequent to a removal process illustrating removal of the second oxide layer down to the hard mask layer according to one or more illustrative embodiments.

Thereafter, with reference to FIG. 11, the second oxide layer 122 is subjected to a planarization or polishing process such as, for example, a chemical mechanical planarization (CMP) process, to remove the oxide material overlying the hard mask layer 110, leaving a segment 122s of the second oxide layer 122 above and surrounding the segments 112s, 114s of the GaN layer 112 and the thin secondary layer 114, respectively.

Thus, in the stage of fabrication depicted in FIG. 11, the semiconductor structure 100 includes the substrate 102 having one or more segments of the upper (100) silicon substrate component 106 surrounding and/or adjacent to the remaining segment 112s of the GaN layer 112 having the <111> crystallographic surface orientation. Otherwise stated, the semiconductor structure includes a base or substrate which integrates a <111> orientation material gallium nitride with a (100) silicon-based material. The upper (100) silicon substrate component 106 and the remaining segment 112s of the GaN layer 112 (having the <111> crystallographic surface orientation) provide platforms or a template upon which to build, or integrate, with various semiconductor devices.

Figure 12:
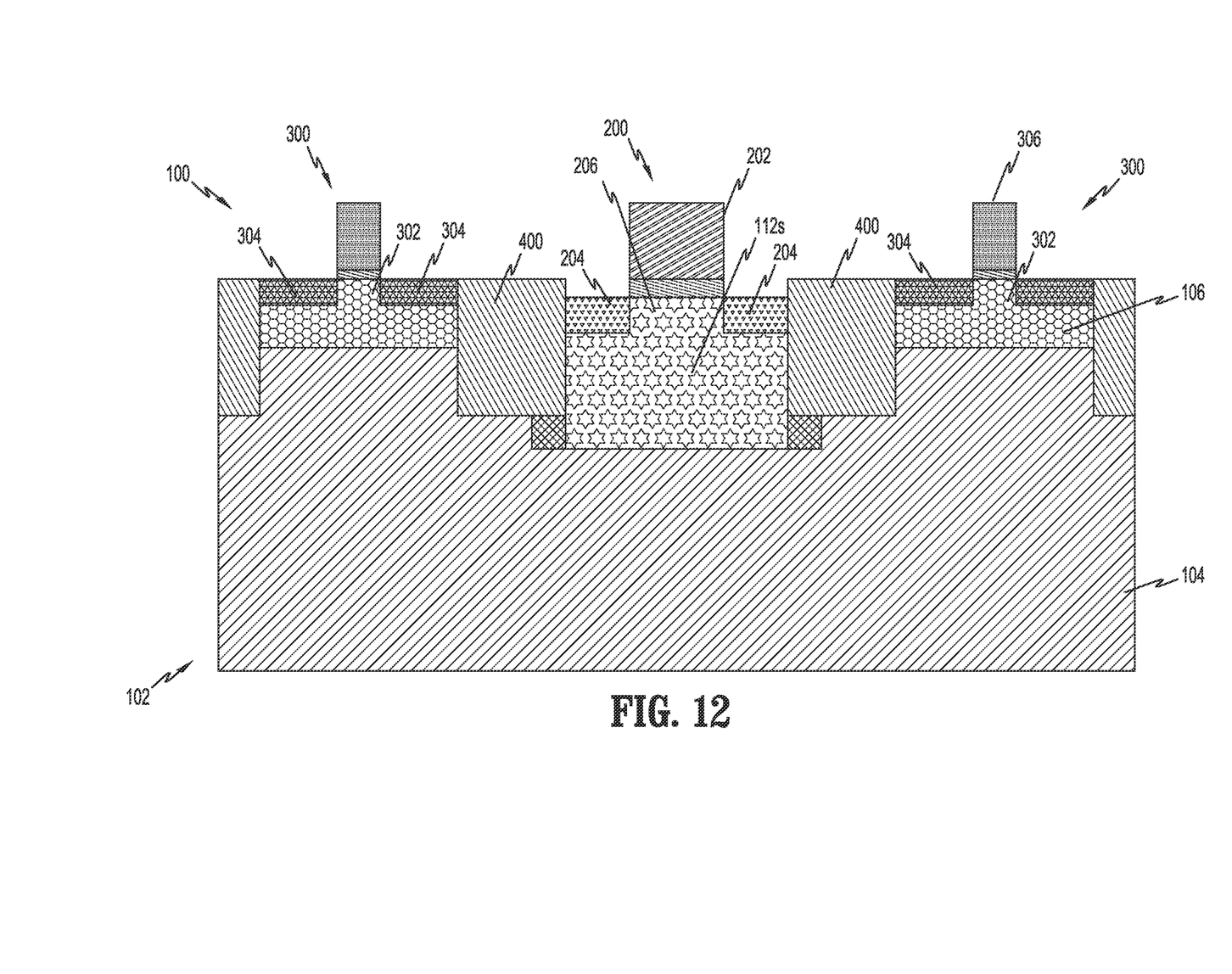
FIG. 12 is a cross-sectional view of the semiconductor structure illustrating formation of one or more semiconductor devices on the exposed gallium nitride layer and on the (100) crystalline silicon layer of the semiconductor according to one or more illustrative embodiments.

FIG. 12 illustrates the semiconductor structure 100 subsequent to building one or more high performance semiconductor devices on the upper (100) silicon substrate component 106 and the remaining segment 112s of the GaN layer 112 (having the <111> crystallographic surface orientation). The hard mask layer 110 is removed via an etching process or the like. In illustrative embodiments, a first CMOS device such as a MOSFET 200 is built on the <111> crystallographic surface of the remaining segment 112s of the GaN layer 112. The <111> GaN MOSFET is superior in performance compared to <100> GaN MOSFET. Any conventional manufacturing techniques may be utilized for constructing the MOSFET 200. As illustrated, the MOSFET 200 includes a conductive gate electrode 202, source and drain regions 204 on each side of the gate electrode 202 and a conductive channel region 206, comprising at least a portion of the remaining segment 112s of the GaN layer 112, beneath the conductive gate electrode 202. The gate electrode 202 may be patterned by a conventional process such as a polysilicon RIE (Reactive Ion Etching) process employing photolithography as will be well understood by those skilled in the art of MOSFET fabrication processes. The type of epitaxial material and doping used to form the source and drain regions 204 will vary depending on whether the contemplated MOS device is an n-channel or a p-channel. For example, for an n-channel MOS, the source and drain regions 204 may comprise an n-doped epitaxial silicon (Si) material, and for a p-channel MOS, the source and drain regions 204 may comprise a p-doped epitaxial silicon-germanium (SiGe) layer. In another embodiment, the source and drain regions 204 include silicide layers that are formed on tops or upper surfaces of the source and drain regions 204 using known methods. In other illustrative embodiments, the source and drain regions 204 may be formed via an ion implantation process(es). In one illustrative embodiment, the source and drain regions 204 may comprise N-type or P-type dopant atoms, formed by introducing dopant atoms via conventional methodologies.

FIG. 12 also depicts one or more second semiconductor devices which are built on the upper (100) silicon substrate component 106. In one illustrative embodiment, the second devices are FINFETS 300 which are fabricated via known semiconductor methodologies. The FINFETS 300 each define a vertical fin 302, source and drain regions 304 and a gate region 306 separating the source and drain regions 304. The vertical fin 302 is comprised of at least a portion of the upper (100) silicon substrate component 106. The FINFET device 300 may be either a pFET or an nFET device manufactured in accordance with conventional processes described hereinabove in connection with the semiconductor structure 100.

The semiconductor structure 100 may further include shallow trench isolation (STI) regions 400 separating and electrically isolating the transistors 200, 300. The shallow trench regions 400 may be fabricated via conventional deposition, lithographic and etching techniques. The STI regions 400 comprise an insulator material including, for example, an oxide such as a silicon oxide and may include a dielectric liner.

In some embodiments, the above-described techniques are used in connection with semiconductor devices that may require or otherwise utilize, for example, complementary metal-oxide-semiconductors (CMOSs), field-effect transistors (FETs), metal-oxide-semiconductor field-effect transistors (MOSFETs), bipolar junction transistors (BJTs) and/or fin field-effect transistors (FINFETs). Otherwise stated, by way of non-limiting example, the semiconductor devices can include, but are not limited to CMOS, FET, MOSFET, BJT and FINFET devices, and/or semiconductor devices that use CMOS, FET, MOSFET, FINFET and/or BJT technology. In other illustrative embodiments, the first and second semiconductor devices may be any of the devices noted hereinabove and, also, may be the same device type. In further illustrative embodiments, the underlying crystalline silicon substrate component 104 and an upper crystalline silicon substrate component 106 may have other crystalline orientations.

Various structures described above may be implemented in integrated circuits. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either: (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

The invention claimed is:

1. A semiconductor structure, comprising:
    a semiconductor substrate comprising a first silicon substrate component having a first crystalline orientation and a second silicon substrate component over and contacting a top surface of the first silicon substrate component and having a second crystalline orientation different from the first crystalline orientation, the semiconductor substrate defining a trench extending through the second silicon substrate component and at least partially within the first silicon substrate component;
    a gallium nitride structure disposed within the trench of the semiconductor substrate to contact a top surface of the first silicon substrate component and form a bottom surface of the trench;
    a first semiconductor device integrated with the gallium nitride structure; and
    a second semiconductor device integrated with the second silicon substrate component, the second semiconductor device being different from the first semiconductor device and the first semiconductor device and the second semiconductor device being separated by one or more shallow trench isolation regions;
    wherein the first crystalline orientation includes a (111) crystalline orientation, the second crystalline orientation includes a (100) crystalline orientation and the gallium nitride structure has the first crystalline orientation.

2. The semiconductor structure according to claim 1 wherein the first semiconductor device is located upon and within the gallium nitride structure.

3. The semiconductor structure according to claim 1 wherein the first semiconductor device includes the gallium nitride structure.

4. The semiconductor structure according to claim 1 wherein the first semiconductor device is one of a field-effect transistor (FET), metal-oxide-semiconductor field-effect transistor (MOSFET), bipolar junction transistor (BJT) and fin field-effect transistor (FINFET).

5. The semiconductor according to claim 4 wherein the first semiconductor device is a MOSFET.

6. The semiconductor structure according to claim 1 wherein the second semiconductor device is different from the first semiconductor device.

7. The semiconductor structure according to claim 6 wherein the second semiconductor device is a fin field-effect transistor (FINFET).

8. The semiconductor structure according to claim 1 including a third semiconductor device integrated with the second silicon substrate component.

9. A semiconductor structure, comprising:
  a semiconductor base substrate comprising a trench filled with a gallium nitride component, a first silicon substrate component having a first crystalline orientation and a second silicon substrate component contacting a top surface of the first silicon substrate component and having a second crystalline orientation different from the first crystalline orientation, wherein the gallium nitride component contacts a top surface of the first silicon substrate component and forms a bottom surface of the trench;
  a first semiconductor device integrated with the gallium nitride component; and
  a second semiconductor device integrated with the second silicon substrate component, the second semiconductor device being different from the first semiconductor device and the first semiconductor device and the second semiconductor device being separated by one or more shallow trench isolation regions;
  wherein the first crystalline orientation includes a (111) crystalline orientation, the second crystalline orientation includes a (100) crystalline orientation and the gallium nitride component has the first crystalline orientation.

10. The semiconductor structure according to claim 9 wherein the first semiconductor device is one of a field-effect transistor (FET), metal-oxide-semiconductor field-effect transistor (MOSFET), bipolar junction transistor (BJT) and fin field-effect transistor (FINFET) and the second semiconductor device is another of the field-effect transistor (FET), metal-oxide-semiconductor field-effect transistor (MOSFET), bipolar junction transistor (BJT) and fin field-effect transistor (FINFET).

11. The semiconductor structure according to claim 9 wherein the first semiconductor device is a metal-oxide-semiconductor field-effect transistor (MOSFET).

12. The semiconductor structure according to claim 9 wherein the second semiconductor device is different from the first semiconductor device.

13. The semiconductor structure according to claim 12 wherein the second semiconductor device is a fin field-effect transistor (FINFET).

14. The semiconductor structure according to claim 9 further including a third semiconductor device integrated with the second silicon substrate component.

15. A method, comprising:
  forming a semiconductor substrate comprising a first silicon substrate component having a first crystalline orientation and a second silicon substrate component over and contacting a top surface of the first silicon substrate component and having a second crystalline orientation different from the first crystalline orientation;
  forming a trench within the semiconductor substrate extending through the second silicon substrate component and at least partially within the first silicon substrate component;
  forming a gallium nitride structure within the trench of the semiconductor substrate to contact a top surface of the first silicon substrate component and form a bottom surface of the trench;
  forming a first semiconductor device integrated with the gallium nitride structure; and
  forming a second semiconductor device integrated with the second silicon substrate component, the second semiconductor device being different from the first semiconductor device and the first semiconductor device and the second semiconductor device being separated by one or more shallow trench isolation regions;
  wherein the first crystalline orientation includes a (111) crystalline orientation, the second crystalline orientation includes a (100) crystalline orientation and the gallium nitride structure has the first crystalline orientation.

16. The method according to claim 15 wherein the second semiconductor device is different from the first semiconductor device.

17. The method according to claim 16 wherein the second semiconductor device is a fin field-effect transistor (FINFET).

18. The method according to claim 15 wherein the first semiconductor device is one of a field-effect transistor (FET), metal-oxide-semiconductor field-effect transistor (MOSFET), bipolar junction transistor (BJT) and fin field-effect transistor (FINFET) and the second semiconductor device is another of the field-effect transistor (FET), metal-oxide-semiconductor field-effect transistor (MOSFET), bipolar junction transistor (BJT) and fin field-effect transistor (FINFET).

19. The method according to claim 15 wherein the first semiconductor device is a metal-oxide-semiconductor field-effect transistor (MOSFET).

20. The method according to claim 15 further including a third semiconductor device integrated with the second silicon substrate component.

* * * * *